United States Patent [19]
Kessler, Jr. et al.

[11] 4,126,879
[45] Nov. 21, 1978

[54] SEMICONDUCTOR DEVICE WITH BALLAST RESISTOR ADAPTED FOR A TRANSCALENT DEVICE

[75] Inventors: Sebastian W. Kessler, Jr., Lancaster, Pa.; John A. Olmstead, Somerville, N.J.

[73] Assignee: RCA Corporation, New York, N.Y.

[21] Appl. No.: 833,056

[22] Filed: Sep. 14, 1977

[51] Int. Cl.² .................... H01L 25/04; H01L 29/74; H01L 27/02

[52] U.S. Cl. .................................. 357/82; 357/38; 357/51; 357/75; 165/80; 165/105

[58] Field of Search .............. 357/36, 38, 51, 74, 357/75, 76, 82; 165/80, 105

[56] References Cited

U.S. PATENT DOCUMENTS

| | | | |
|---|---|---|---|
| 3,178,804 | 4/1965 | Ullery et al. | 357/51 |
| 3,462,658 | 8/1969 | Worchei et al. | 357/36 |
| 3,577,037 | 5/1971 | Dipietro | 357/51 |
| 3,609,476 | 9/1971 | Storm | 357/56 |
| 3,614,480 | 10/1971 | Berglund | 357/51 |
| 3,739,235 | 6/1973 | Kessler | 357/38 |
| 3,743,897 | 7/1973 | Harnden | 357/51 |

Primary Examiner—Andrew J. James
Attorney, Agent, or Firm—E. M. Whitacre; G. H. Bruestle; G. E. Haas

[57] ABSTRACT

An improvement for a transcalent semiconductor device includes a semiconductor ballast resistor in contact with the emitter regions of a semiconductor transistor. The semiconductor transistor with the ballast resistor in contact therewith is sandwiched between two closed heat pipes wherein one heat pipe is in thermal and electrical contact with the transistor and the other heat pipe is in thermal and electrical contact with the resistor.

8 Claims, 2 Drawing Figures

SEMICONDUCTOR DEVICE WITH BALLAST RESISTOR ADAPTED FOR A TRANSCALENT DEVICE

The Government has rights in this invention pursuant to Contract No. DAAK 02-72-C-0642, awarded by the Department of the Army.

BACKGROUND OF THE INVENTION

The present invention relates to power transistors and transcalent power devices incorporating such transistors.

The transcalent device is an operable electronic device having at least one heat pipe connected to it. Many transcalent devices which operate at high current comprise a semiconductor wafer sandwiched between two heat pipes to provide additional cooling of the semiconductor wafer. The two heat pipes are usually joined together with a structural member which protects the edge of the semiconductor device and maintains the semiconductor device under compression. The heat pipes in transcalent devices are in thermal and electrical contact with the semiconductor device. However, in order to evenly distribute the current within the body of the transistor device, the emitter is usually comprised of a plurality of heavily doped mutually interconnected emitter members in contact with the base of the transistor. The emitter members usually have a metallization layer on their exposed surface by which an external contact can be made.

Connection of a heat pipe directly to each of the individual emitter contacts has not provided good thermal and electrical contact whereby current and thermal dissipation are equally distributed among the individual emitter members. Thus, a transistor with sufficient current distribution for high current operation has not heretofore been available.

SUMMARY OF THE INVENTION

A semiconductor wafer has two opposed surfaces with a plurality of first conductivity type regions along one surface. A semiconductor ballast resistor has a plurality of mesas which are electrically connected to the regions along the one surface of the transistor. The transistor and ballast resistor are preferably sandwiched between two heat pipes to provide cooling for the device.

DETAILED DESCRIPTION OF THE INVENTION

Figure 1:
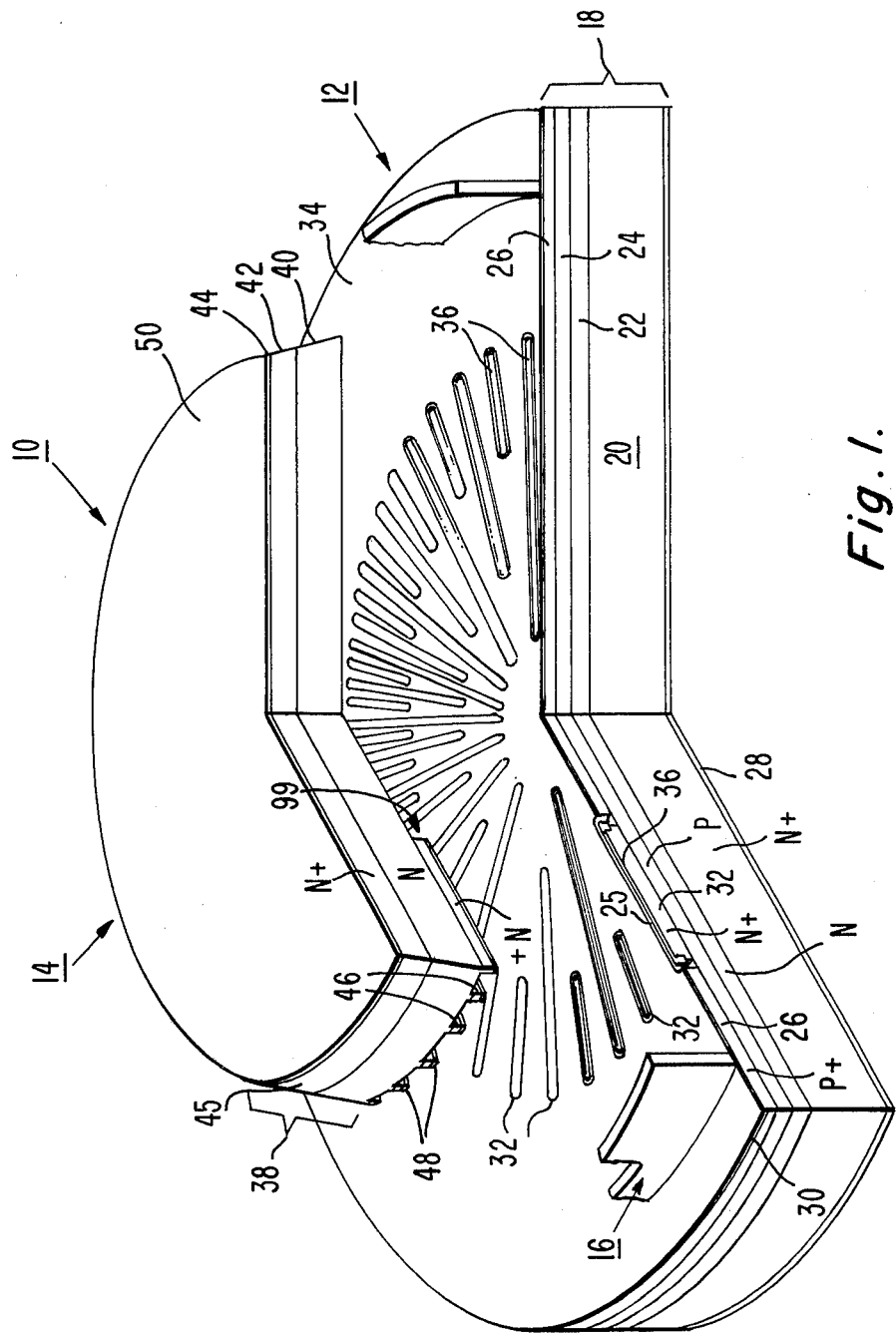
FIG. 1 is a sectional prespective view of a power device according to the present invention.

With initial reference to FIG. 1, a power device 10 includes a semiconductor transistor 12 and a ballast resistor 14 thermally and electrically attached to one another. For the purpose of illustration, the transistor 12 and resistor 14 have been separated in FIG. 1.

The transistor 12 is in the form of a wafer 18 which comprises a relatively heavily doped first layer 20 of a first conductivity type material, for example, N type, and a relatively moderately doped second layer 22 on the first region. The second layer 22 is of the same conductivity type as the first layer 20 and forms a collector. The first layer 20 interconnects the collector layer 22 with a collector contact 28 which may be comprised, for example, of alternate layers of paladium, tungsten, and nickel.

A relatively moderately doped third layer 24 of an opposite conductivity type is on the collector layer 22 and forms the base of the semiconductor transistor 12. A relatively heavily doped fourth layer 26 of the opposite conductivity type is contiguous with the base layer 24. The fourth layer 26 is a base interconnection region for the transistor 12 and has a base contact 30 thereon comprised of alternate layers of paladium, tungsten, and nickel, for example. The base contact 30 has a major surface 34.

Located in the fourth layer 26 are a plurality of relatively heavily doped semiconductor emitter regions 32 of the first conductivity type. Each emitter region 32 is contiguous with the base layer 24 and is surrounded by a moat-like aperture 25 to isolate the region from the fourth layer and the other emitter regions. Each of the emitter regions 32 may be shaped in the form of an elongated finger having a major surface coated with an emitter contact 36 formed by alternate layers of paladium, tungsten and nickel, for example. The emitter regions 32 are arranged in a radially symmetrical pattern centrally located on the surface 34 of the transistor 12. The surface of each emitter contact 36 is flush with the major surface 34 of the transistor 12.

An electrically conductive ring 16 of molybdenum is attached to a major surface 34 of the base contact 30 so as to surround the emitter regions 32 and the ballast resistor 14. The ring 16 serves as a base electrical contact 30 for the device and distributes the base current evenly around the wafer 18.

The ballast resistor 14 is formed from a uniformly doped semiconductor wafer 38 in which ohmic contacts are diffused. The body of the wafer 38 is comprised of a relatively moderately doped first resistor layer 40 of the first conductivity type material and a relatively heavily doped second resistor layer 42 also of the first conductivity type material and contiguous with the first resistor layer 40. Deposited on the second resistor layer 42 is a resistor contact 44, similar to the base contact 30, which serves as an emitter contact for the power device 10. The wafer 38 further comprises a plurality of integral mesa fingers 46 formed of a layer of relatively heavily doped first conductivity type material and extending from the first resistor layer 40. The fingers 46 are arranged in a pattern which forms a mirror symmetric image of the emitter region pattern and extends to the lateral edge 45 of the wafer 38. A finger contact 48 comprised of a heavily gold plating on alternate layers of paladium, tungsten and nickel is deposited on the bottom surface of the mesa fingers 46. The resistance of the ballast resistor 14 is determined by the bulk resistivity and thickness of the first layer 40.

The resistor contact 44 has a surface 50 which is adapted to receive a means for conducting heat away from and making electrical contact with, the resistor 14. Similarly, the collector contact 28 is also planar and adapted to receive another means for conducting heat away from, and making electrical contact with, the transistor 12.

Although in the preferred embodiment shown in FIG. 1, the transistor 12 is an NPN transistor and the ballast resistor 14 is comprised of an N type semiconductor wafer, a P type ballast resistor could be used.

Alternately, the transistor 12 may be a PNP transistor with a P type ballast resistor 14.

One function of the plurality of the emitter regions 32 is to evenly distribute the current flow through the body of the semiconductor wafer 12 so that no one particular part of the wafer has a greater amount of heat to dissipate than any other part. Although the plurality of emitter regions 32 adequately distribute the current flow through the transistor 12, it does not prevent one emitter region from having a lower base to emitter voltage drop, $V_{BE}$, than another. An emitter with a lower $V_{BE}$ than its neighboring emitters could possibly enter thermal runaway. The use of the ballast resistor 14 controls the current flow to each of the emitter regions 32 so as to prevent them from entering thermal runaway. In particular, the mesa fingers 46 of the ballast resistor 14 are mated with and attached to the emitter regions 32 so that the ballast resistor only contacts the transistor 12 at the interface between the finger contacts 48 and the emitter contacts 36. The ballast resistor 14 is completely isolated from the base ring 16 as well as the base contact 30. Additionally, the ballast resistor 14 provides means for connecting the plurality of emitter regions 32 to a planar contact surface 50 of the resistor contact 44.

Figure 2:
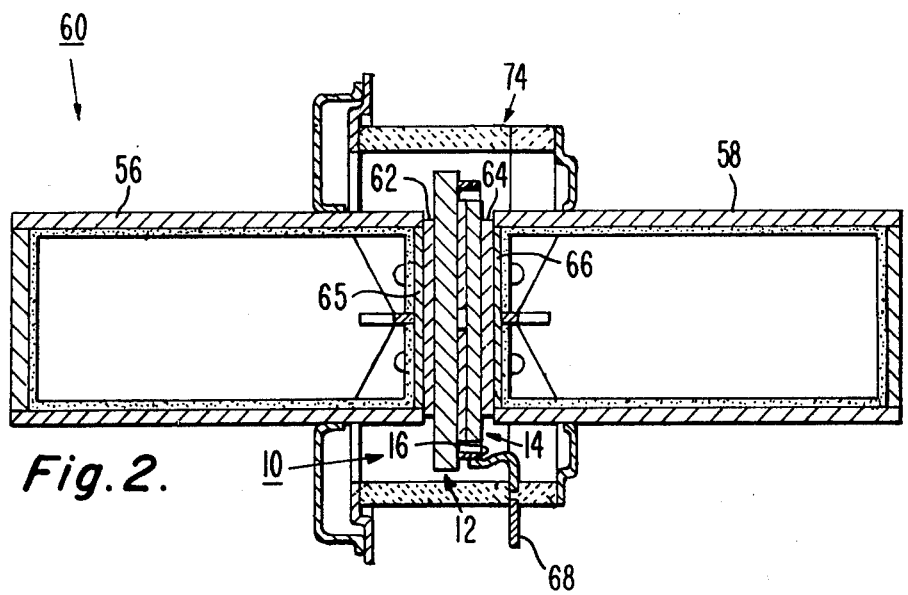
FIG. 2 is a longitudinal sectional view of the device in FIG. 1 with heat pipes attached.

With reference to FIG. 2, the power device 10 is sandwiched between two heat pipes 56 and 58 to form a transcalent device 60 similar to that disclosed in U.S. Pat. No. 3,978,518, entitled "Reinforced Transcalent Device" issued on August 31, 1976 to S. W. Kessler, Jr. et al, which is incorporated herein by reference. The first heat pipe 56 is in contact with the collector of the transistor 12. The contact may be provided by a thin metal disc 62 or by soldering the collector contact 28 and the end 65 of the heat pipe to one another. The second heat pipe 58 is connected to the ballast resistor 14 by means of a thin metal contact disc 64 which is between the resistor contact 44 and one end 66 of a second heat pipe 58. A tubular insulated envelope 74 is connected to both the first and second heat pipes 56 and 58, respectively, so as to maintain the power device 10 in compression between the two heat pipes, thereby insuring good thermal and electrical contact. The first heat pipe 56 provides external electrical contact for the collector of the transcalent device 60 and the second heat pipe 58 provides the emitter contact for the device. A base contact 68 extends through the compression envelope 74 and makes contact with the base ring 16.

The compression of the power device 10 between the two heat pipes not only insures good thermal and electrical contact between the heat pipes and power devices 10, but also insures good contact between the transistor 12 and the resistor 14. As an alternative, the transistor and resistor 12 and 14, respectively, may be joined by soldering, once they have been aligned.

To facilitate construction of the above-identified device, the ballast resistor 14 is cut from a semiconductor wafer at an angle so that the lateral edge 45 of the resistor 14 is tapered. The tapering of the edge of the resistor 14 permits visual observation of the outer tips of the mesa fingers 46 thus permitting orientation thereof with respect to the emitter regions 32 on the transistor 12 during assembly. A modified mask aligner (not shown) is used to align the mesa fingers 46 of the ballast resistor 14 with the emitter fingers 32. The collector contact 28 may be first soldered to the first heat pipe 56. This subassembly is then mounted in the aligner with the transistor 12 facing up. The aligner permits the subassembly to move only up and down. The ballast resistor 14 is then held in a vacuum chuck, for example, and located above the heat pipe transistor subassembly. The vacuum chuck is equipped with an $x$, $y$ and rotational micrometer adjustment to complement the up-and-down adjustment of the subassembly fixture. The modified mask aligner is constructed to permit visual observation through a microscope of the emitter regions 32 and the mesa fingers 46. The beveling of the lateral edge 45 of the resistor wafer 38 permits observation of the emitters 32 and the exposed ends of the fingers 46 along the edge 45. Alternately, a hole may be etched in the center of the resistor wafer 38 which will permit this observation. The resistor 14 is then aligned on the transistor 12 by visual inspection. Verification of the alignment may be accomplished by connecting the transistor-resistor assembly to a transistor curve tracer and evaluating the device characteristics.

Once proper alignment of the resistor and transistor has been attained, they are physically held together by an adhesive which will not flow between the mesa fingers 46 and the emitters 32, such as cured silicon rubber, for example. The adhesive is applied in small quantities to the edge 45 of the resistor 14 and the surface 34 of the transistor. Next, the second heat pipe 58 is clamped to the first heat pipe 56 so as to make contact with the surface 50 of the resistor 14. While the device is clamped, the two halves of the envelope 74 are attached to both of the heat pipes 56 and 58 and then joined in a manner similar to that disclosed in U.S. Pat. No. 3,978,518. The envelope 74 places the semiconductor device 10 in compression between the two heat pipes.

We claim:

1. A semiconductor device comprising:
    a first body of semiconductor material having first and second major opposing surfaces, and a plurality of regions of a first conductivity type extending along the first surface;
    a second body of semiconductor material of a given conductivity type forming a resistor, the second body having opposed first and second major surfaces and a plurality of mesa fingers extending from the first major surface in a substantially mirror symmetrical pattern with respect to the regions of the first body; and
    means for securing the second body to the first body such that each of the mesa fingers is in electrical and thermal contact with a corresponding first region.

2. The device as in claim 1 wherein the first body of semiconductor material comprises:
    a heavily doped first layer of a first conductivity type, the first layer extending along the second major surface of the first body;
    a moderately doped second layer of the first conductivity type contiguous with the first layer;
    a moderately doped third layer of a second conductivity type contiguous with the second layer;
    a heavily doped fourth layer of the second conductivity type material contiguous with the third layer, the fourth layer extending along the first major surface of the first body; and
    the regions of the first type conductivity being heavily doped and extending into the fourth layer, each region being surrounded by a moat and contiguous with the third layer.

3. The device as in claim 1 wherein the second body comprises:

a first layer of moderately doped first conductivity type extending along the first surface;

a second layer of heavily doped first conductivity type contiguous with the first layer and extending along the second surface; and said mesa fingers being of heavily doped first conductivity type and extending from the first layer.

4. The device as in claim 1 wherein the second body of semiconductor material further comprises:

a lateral edge extending between the first and second opposed major surfaces, the edge being beveled so that the second major surface of the second body is smaller than the first major surface of the second body; and the mesa fingers extend to the lateral edge.

5. A transcalent semiconductor device comprising:

a first body of semiconductor material having first and second major opposing surfaces, and a plurality of regions of first type conductivity extending along the first surface;

a second body of semiconductor material having said first type conductivity forming a resistor, the second body having opposed first and second major surfaces and a plurality of mesa fingers extending from the first major surface in a substantially mirror symmetrical pattern with respect to the regions of the first body;

a first heat pipe in electrical and thermal contact with the second major surface of the first body; and a second heat pipe in electrical and thermal contact with the second major surface of the second body so as to sandwich the first and second bodies between the first and second heat pipes.

6. The device as in claim 5 further comprising:

a first contact on the second major surface of the first body;

a second contact on the first major surface of the first body;

a third contact on the first major surface of the second body; and a fourth contact on the second major surface of the second body.

7. The device as in claim 6 wherein the first body of semiconductor material is soldered to the first heat pipe.

8. The device as in claim 7 further including a thin metal body between the second body of semiconductor material and the second heat pipe.

* * * * *